(12) United States Patent
Steinke et al.

(10) Patent No.: US 9,668,382 B2
(45) Date of Patent: May 30, 2017

(54) COOLANT DISTRIBUTION UNIT FOR A MULTI-NODE CHASSIS

(71) Applicant: Lenovo Enterprise Solutions (Singapore) Pte. Ltd., Singapore (SG)

(72) Inventors: Mark E. Steinke, Durham, NC (US); Derek I. Schmidt, Raleigh, NC (US); Jason A. Matteson, Raleigh, NC (US); Vinod Kamath, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/823,414

(22) Filed: Aug. 11, 2015

(65) Prior Publication Data

US 2017/0049009 A1 Feb. 16, 2017

(51) Int. Cl.
*H05K 7/20* (2006.01)

(52) U.S. Cl.
CPC ..... *H05K 7/20781* (2013.01); *H05K 7/20736* (2013.01)

(58) Field of Classification Search
CPC ........... H05K 7/20781; H05K 7/20736; H05K 7/20154; G06F 2200/201; G06F 1/206
USPC ........................ 361/679.46–679.54, 688–723
See application file for complete search history.

(56) References Cited

U.S. PATENT DOCUMENTS

| | | | | |
|---|---|---|---|---|
| 2009/0262501 A1* | 10/2009 | Claassen | .................. | G06F 1/20 361/701 |
| 2010/0103618 A1* | 4/2010 | Campbell | .......... | H05K 7/20772 361/699 |
| 2012/0279233 A1* | 11/2012 | Chainer | ............. | H05K 7/20781 62/3.6 |
| 2012/0298335 A1* | 11/2012 | Eckberg | ............... | H05K 7/2079 165/104.19 |
| 2013/0105116 A1* | 5/2013 | Campbell | .......... | H05K 7/20272 165/80.4 |
| 2014/0133099 A1* | 5/2014 | Campbell | .......... | H05K 7/20781 361/698 |
| 2014/0163764 A1* | 6/2014 | Campbell | ............ | H05K 7/2079 700/300 |
| 2015/0109735 A1* | 4/2015 | Campbell | .......... | H05K 7/20318 361/700 |
| 2016/0242319 A1* | 8/2016 | Edwards | ............ | H05K 7/20781 |

* cited by examiner

*Primary Examiner* — Anthony Haughton
*Assistant Examiner* — Yahya Ahmad
(74) *Attorney, Agent, or Firm* — Jeffrey L. Streets

(57) ABSTRACT

A system includes a chassis, a plurality of nodes, a coolant distribution unit (CDU), and one or more air movers. The chassis includes multiple node bays, a CDU bay, a coolant supply manifold with an inlet in the CDU bay and an outlet in each node bay, and a coolant return manifold an inlet in each node bay and an outlet in the CDU bay. Each node is received into a node bay with an internal heat exchanger connected between a coolant supply and return manifolds. The CDU is received in the CDU bay and includes an air-to-coolant heat exchanger in fluid communication between the supply and return manifolds, and a pump for circulating a coolant through a coolant loop. The one or more air movers force air across the air-to-coolant heat exchanger of the CDU.

15 Claims, 5 Drawing Sheets

COOLANT DISTRIBUTION UNIT FOR A MULTI-NODE CHASSIS

BACKGROUND

Field of the Invention

The present invention relates to systems and methods for cooling heat-generating components in a computer system.

Background of the Related Art

Computer systems are being designed and built with an ever increasing number of heat generating components. Given the limited footprint of most computing systems, a continuous increase in the number of heat generating components creates challenging heat dissipation issues. These issues if not dealt with adequately can harm the structural and data integrity of the computer system, making the effect felt both at a system and component level.

Most electronic packages or nodes in a datacenter are housed in chassis disposed in racks. Traditionally, these nodes have been cooled by forced air cooling using air moving devices, such as fans and blowers, selectively disposed somewhere in the environment as to allow optimum air flow. These air moving devices are often designed to displace hot air away from the components by creating parallel air flow paths that circulate through the chassis and rack. Air moving systems may take the form of a computer room air conditioning (CRAC) system, a chassis fan system, or fans in an individual node or group of nodes.

As the density and performance of heat generating components increases, air cooling solutions are becoming more prohibitive and costly. Although attention has been directed to air cooling of high heat flux microprocessor modules, an increase in overall system performance also requires large amounts of on-board memory with increasing power consumption.

In recent years, direct or indirect water cooling has become a more attractive option for the designers of computing systems. Water cooled systems have been shown in some circumstances, such as large data centers, to consume less energy than a similar air cooled system. However, a water cooled system typically requires a significant up-front investment in infrastructure to support water cooling.

BRIEF SUMMARY

One embodiment of the present invention provides a system comprising a chassis, a plurality of nodes, a coolant distribution unit (CDU), and one or more air movers. The chassis includes a plurality of node bays, a coolant distribution unit bay, a coolant supply manifold, and a coolant return manifold, wherein the coolant supply manifold includes a coolant supply outlet in each of the node bays and a coolant supply inlet in the coolant distribution unit bay, and wherein the coolant return manifold includes a coolant return inlet in each of the node bays and a coolant return outlet in the coolant distribution unit bay. The plurality of nodes each have an internal heat exchanger, and each node is operatively received into one of the node bays with the internal heat exchanger in fluid communication with one of the coolant supply outlets and one of the coolant return inlets. The coolant distribution unit includes an inlet conduit, an outlet conduit, an air-to-coolant heat exchanger in fluid communication between the inlet conduit and the outlet conduit, and a pump for circulating a coolant from the inlet conduit through the air-to-coolant heat exchanger to the outlet conduit, wherein the coolant distribution unit is operatively received in the coolant distribution unit bay with the outlet conduit in fluid communication with the coolant supply inlet of the coolant supply manifold and with the inlet conduit in fluid communication the coolant return outlet of the coolant return manifold. The one or more air movers are positioned for moving air through the air-to-coolant heat exchanger of the coolant distribution unit.

DETAILED DESCRIPTION

Figure 1:
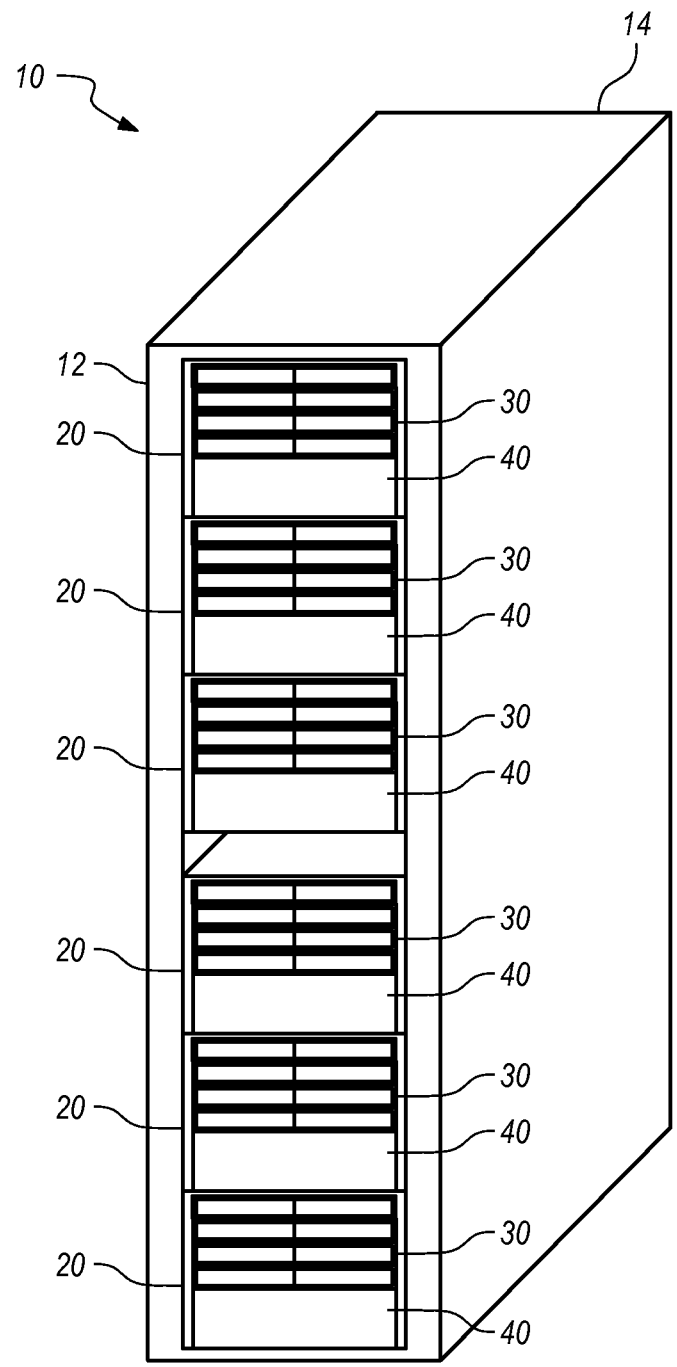
FIG. 1 is a perspective view of a rack supporting several chassis each having a self-contained coolant distribution unit (CDU).

One embodiment of the present invention provides a system comprising a chassis, a plurality of nodes, a coolant distribution unit (CDU), and one or more air movers. The chassis includes a plurality of node bays, a coolant distribution unit bay, a coolant supply manifold, and a coolant return manifold, wherein the coolant supply manifold includes a coolant supply outlet in each of the node bays and a coolant supply inlet in the coolant distribution unit bay, and wherein the coolant return manifold includes a coolant return inlet in each of the node bays and a coolant return outlet in the coolant distribution unit bay. The plurality of nodes each have an internal heat exchanger, and each node is operatively received into one of the node bays with the internal heat exchanger in fluid communication with one of the coolant supply outlets and one of the coolant return inlets. The coolant distribution unit includes an inlet conduit, an outlet conduit, an air-to-coolant heat exchanger in fluid communication between the inlet conduit and the outlet conduit, and a pump for circulating a coolant from the inlet conduit through the air-to-coolant heat exchanger to the outlet conduit, wherein the coolant distribution unit is operatively received in the coolant distribution unit bay with the outlet conduit in fluid communication with the coolant supply inlet of the coolant supply manifold and with the inlet conduit in fluid communication the coolant return outlet of the coolant return manifold. The one or more air movers are positioned for moving air through the air-to-coolant heat exchanger of the coolant distribution unit.

The chassis may operate as a stand-alone chassis or may be supported in a rack along with other electronic equipment, such as another similar multi-node chassis or other configurations of multi-node chassis or individual nodes. In one embodiment, a rack supports first and second units of the multi-node chassis, wherein the coolant supply manifold and the coolant return manifold of the first unit are independent of the coolant supply manifold and the coolant return manifold of the second unit.

In another embodiment, the coolant distribution unit bay may be located below the plurality of node bays, such that the coolant distribution unit may be positioned below the plurality of coolant-cooled nodes. In a separate embodiment, the plurality of node bays may be 1 U (one unit height) bays and the coolant distribution unit bay may be a 2 U (two unit height) bay. Optionally, a 1 U node bay may receive a 1 U tray including two of the coolant-cooled nodes, wherein the two coolant-cooled nodes are fluidically in parallel and share one of the coolant supply outlets and one of the coolant return inlets.

The coolant supply manifold and the coolant return manifold may be secured in a fixed position with the multi-node chassis, most preferably in a distal end of the chassis to allow insertion of the nodes and coolant distribution unit into respectively bays via a front or proximal end of the chassis. The inlets and outlets of the manifolds may be aligned with the respective bays. More specifically, the inlets and outlets of the manifold include quick connects that are secured in a predetermined positioned for alignment with corresponding quick connects of the respective nodes and coolant distribution unit. The plurality of coolant-cooled nodes are preferably independently blind connected to the coolant supply manifold and the coolant return manifold at a distal end of the plurality of node bays, and the coolant distribution unit is preferably independently blind connected to the coolant supply manifold and the coolant return manifold at a distal end of the coolant distribution unit bay. The plurality of nodes may further include power connectors and network connectors that also blind mate with corresponding connectors in the multi-node chassis.

The plurality of nodes each have an internal heat exchanger, such as a cold plate for being cooled by a coolant. A cold plate is preferably in directly thermally conductive contact with a heat-generating component, such as a microprocessor or dual inline memory module (DIMM). Coolant is circulated through the cold plate to remove heat from the cold plate and the heat-generating component.

The chassis may further include a power supply unit that supplies electrical power to the pump of the coolant distribution unit. In one option, the coolant distribution unit includes a first pump and a redundant second pump in parallel fluid communication with the first pump, wherein either or both of the first and second pumps can circulate the coolant from the inlet conduit through the air-to-coolant heat exchanger to the outlet conduit. If the chassis includes one or more air movers, then the power supply unit may further supply electrical power to the one or more air movers. Optionally, the coolant distribution unit may include a power interposer board (PIB) that provides the CDU with electrical power from a chassis power supply unit and provides communication with a management entity, such as a management node and ultimately the user for monitoring and management of the CDU device.

The coolant itself may be any fluid, fluid mixture, or a solution. A preferred coolant is water due to the low cost, convenience and ease of handling and material compatibility. Another suitable coolant is a mixture of water and glycol. The coolant may optionally include one or more additives, such as an antimicrobial agent. As used herein, reference to a "coolant" or "water" should be interpreted broadly to include fluid whether or not the fluids are pure or contain other components.

The one or more air movers may be fans, blowers, electrostatic devices or some combination thereof. Furthermore, the one or more air movers may be installed in the multi-node chassis, installed in the coolant distribution unit, or both the multi-node chassis and the coolant distribution unit. For example, the one or more air movers may include a first set of fans installed in the multi-node chassis and a second set of fans installed in the coolant distribution unit. Regardless of the configuration of the air movers, the one or more air movers may be directed to move air across a surface of the air-to-coolant heat exchanger in the coolant distribution unit. The air-to-coolant heat exchange may, for example, include a fin tube or a fin stack radiator.

It should be recognized that the system of the present invention may be operated in accordance with various control schemes in order to prevent thermal damage to heat-generating components of the nodes. Preferably, the heat-generating component are maintained at operating temperatures that facilitate high performance and low power consumption. In one non-limiting example, the pump is operated to control a processor temperature within each of the coolant-cooled nodes, and the one or more air movers are operated to control a coolant temperature at an outlet end of the air-to-coolant heat exchanger.

FIG. 1 is a perspective view of a rack 10 supporting several chassis 20. Each chassis 20 may receive a plurality of nodes 30 and a modular, self-contained coolant distribution unit (CDU) 40. The chassis 20 may be inserted into a proximal end 12 of the rack 10 and extend toward a distal end 14 of the rack 10. Similarly, the nodes 30 and the coolant distribution unit 40 may be inserted into a proximal end of the chassis 20 and extend toward a distal end of the chassis 20.

Figure 2:
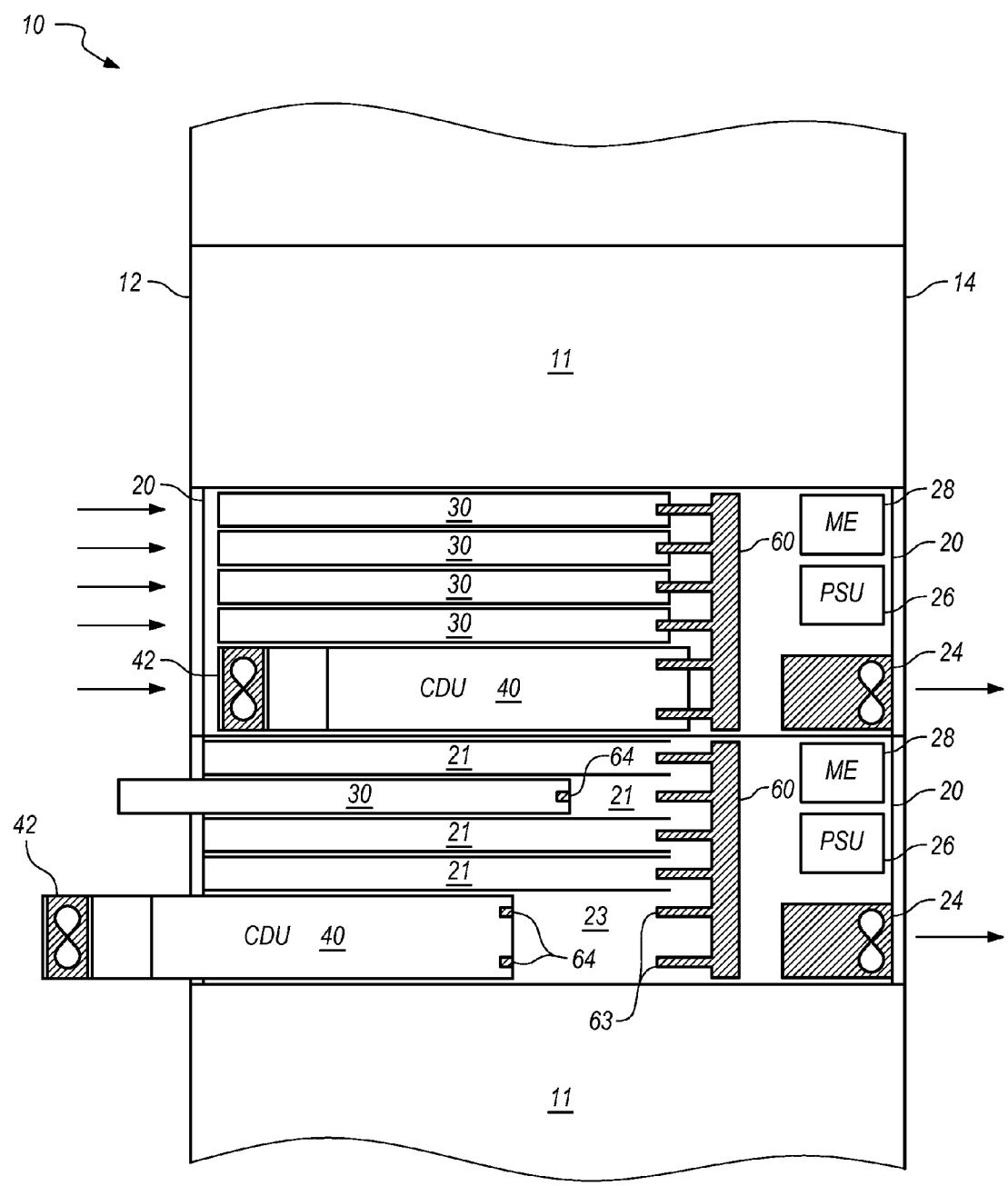
FIG. 2 is a side view of a rack supporting one fully populated chassis and one chassis receiving a server and a coolant distribution unit.

FIG. 2 is a side view of the rack 10 supporting one fully populated chassis 20 and one chassis 20 receiving a server 30 and a coolant distribution unit 40. The rack 10 may include multiple chassis bays 11 for receiving multiple chassis 20. Each chassis 20 may include a plurality of node bays 21 for receiving a node 30 and a coolant distribution unit bay 23 for receiving a coolant distribution unit 40. As shown, the nodes 30 and the coolant distribution units 40 are inserted from a proximal end of the chassis 20, which corresponds with the proximal end 12 of the rack 10.

Each chassis 20 includes a coolant supply manifold 60 and a coolant return manifold (not shown; see FIGS. 3-6) positioned with quick connect fittings 63 aligned with each node bay 21 and the coolant distribution unit bay 23. Each node 30 and coolant distribution unit 40 has corresponding quick connect fittings 64 for blind mating with an aligned quick connect fitting 63.

Quick connect couplings are well-known couplings that allow quick and easy connections, such as between two fluid conduits. A first fluid conduit may terminate in a first quick connect connector and a second fluid conduit may terminate in a second quick connect connector that mates with first quick connect connector in order to provide fluid communication between the first and second fluid conduits. In one example, a compute node includes a cooling circuit coupled between two quick connect connectors that may blind mate with two mating quick connect connectors secured to a fluid supply manifold and a fluid return manifold, respectively. A typically cooling circuit may include a fluid cooled heat exchanger or cold plate in thermal contact with a heat-generating device, such as a microprocessor or a dual inline memory module (DIMM).

The two quick connect connectors of a quick connect coupling are typically dissimilar but complimentary, such as one male connector and one female connector. Typically, male and female quick connect connectors may be coupled together regardless of the direction of fluid flow or the direction of movement of one connector to the other connector. Accordingly, in the present examples, the male and female quick connect connectors will be equally operable if their positions are reversed. Most preferably, each of the quick connect connectors will include an automatic shut off valve that prevents fluid flow when disconnected. An example of a compliant quick connect coupling is described in U.S. patent application Ser. No. 14/472,608, which application is incorporated by reference herein.

Each chassis 20 may further include one or more air movers 24 for moving air through the nodes 30 and coolant distribution unit 40 that are installed in the chassis 20. The coolant distribution units 40 shown in FIG. 2 further include their own one or more air movers 42, shown as fans. Still further, the chassis 20 may include a power supply unit (PSU) 26 for providing power to the air movers 24, 42 and other electronic components of the chassis 20, nodes 30, and coolant distribution unit 40. A management entity 28 may also be included for monitoring and controlling the operation of the coolant distribution unit 40.

Figure 3:
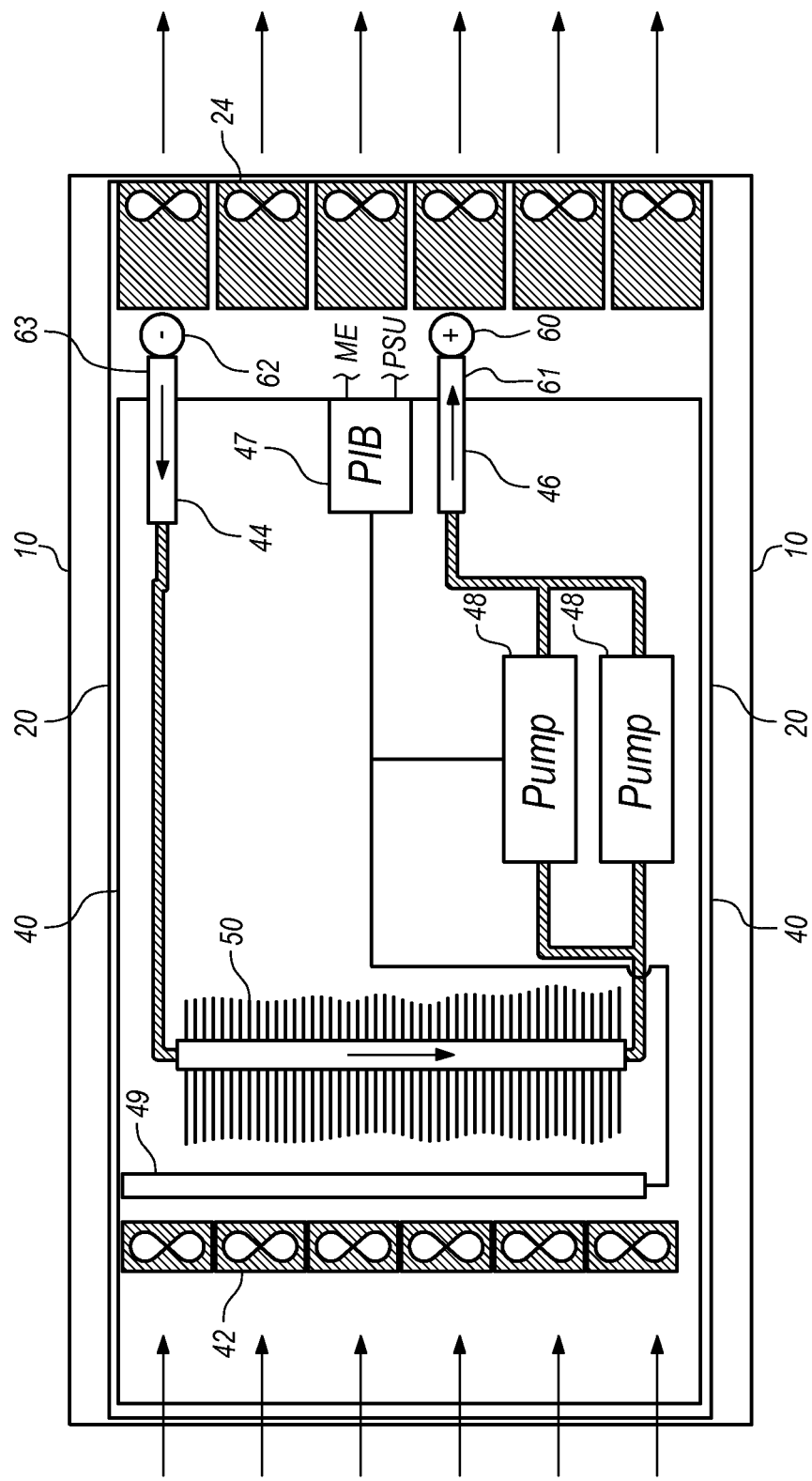
FIG. 3 is a plan view of a coolant distribution unit installed in a chassis.

FIG. 3 is a plan view of a coolant distribution unit 40 installed in a chassis 20 that is itself supported in a rack 10. As shown, the coolant distribution unit 40 has a warm coolant return conduit 44 blind connected to an outlet 63 from the coolant return manifold 62 and a cool coolant supply conduit 46 blind connected to an inlet 61 to the coolant supply manifold 60. Both of these connections may include mating quick connect fittings.

A pair of redundant pumps 48 are fluidically in parallel in order to force circulation of a coolant through a coolant loop that includes the coolant distribution unit 40 and at least one of the nodes 30 (see FIG. 2). Specifically, the one or both of the pumps 48 draw coolant from the warm coolant return conduit 44 (and the coolant return manifold 62), through an air-to-coolant heat exchanger 50 to the cool coolant supply conduit 46 (and the coolant supply manifold 60).

A power interposer board (PIB) 47 may be electrically connected to the power supply unit (PSU) 26 (see FIG. 2) and provide electrical power to the pumps 48 and a fan power card 49. Optionally, the power interposer board 47 may also provide communication between the coolant distribution unit 40 and a management entity (ME) 28 (see FIG. 2) to enable a user to monitor and manage operation of the CDU.

The coolant distribution unit 40 is shown having an onboard set of fans 42 that push air through the air-to-coolant heat exchanger 50. Furthermore, the multi-node chassis 20 is shown having a set of chassis fans 24 for pulling air through the air-to-coolant heat exchanger 50. Furthermore, the set of chassis fans 24 may also pull air through each of the nodes 30 (see FIG. 2) in order to cool various components that generate heat, but not so much heat as to warrant the use of a cold plate. Embodiments of the present invention may include either or both of the sets of fans 42, 24.

Figure 4:
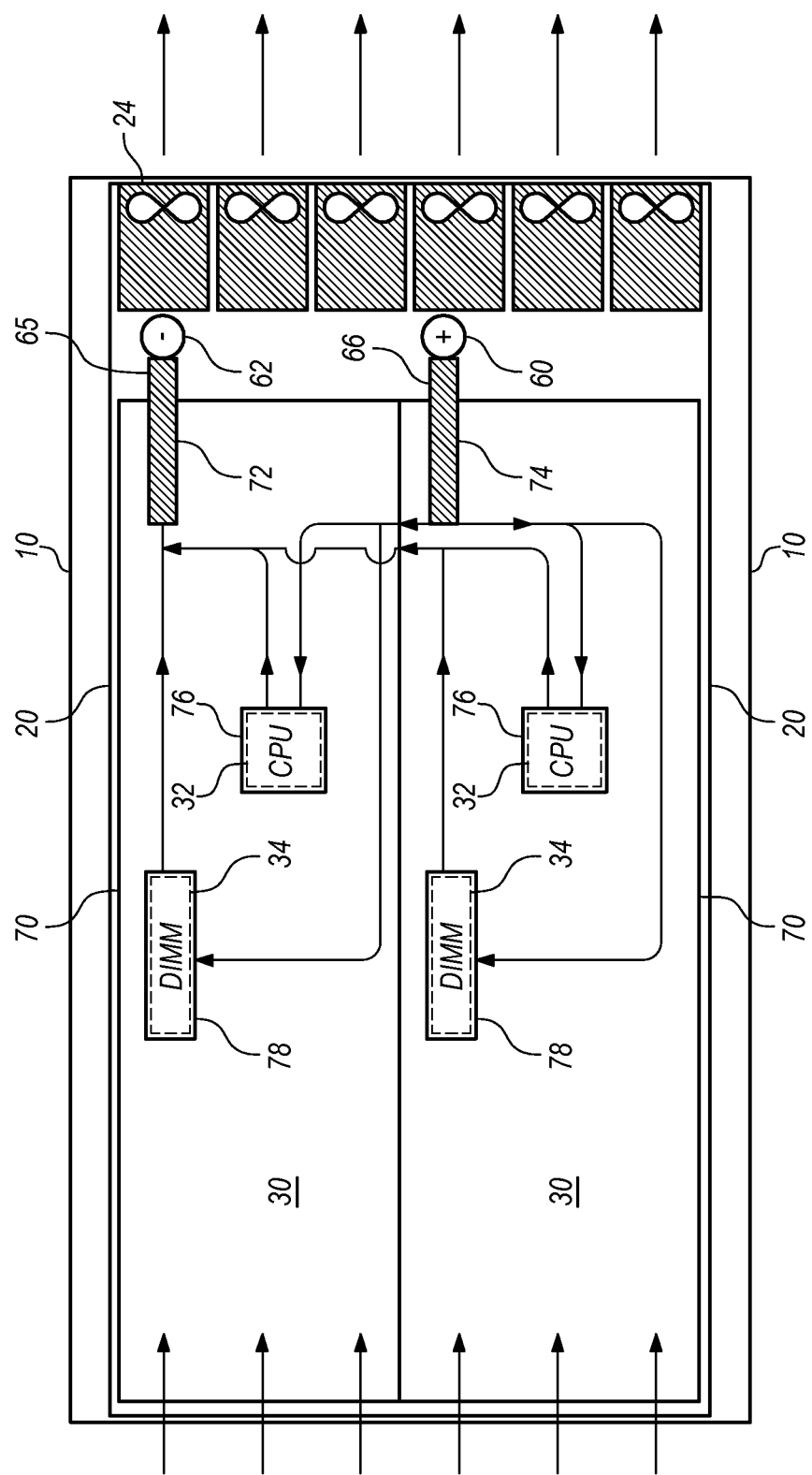
FIG. 4 is a plan view of a 1 U tray including two servers installed in a chassis.

FIG. 4 is a plan view of a 1 U tray 70 including two nodes 30 installed in a chassis 20 which is received in the rack 10. As shown, the 1 U tray 70 has a warm coolant return conduit 72 blind connected to an inlet 65 to the coolant return manifold 62 and a cool coolant supply conduit 74 blind connected to an outlet 66 from the coolant supply manifold 60. Both of these connections may include mating quick connect fittings.

The two nodes 30 share the warm coolant return conduit 72 and the cool coolant supply conduit 74, but split off separate coolant circuits from there. As shown, each node 30 includes a CPU 32 (dashed lines) that is coolant fluid-cooled with a cold plate 76 and DIMMs 34 (dashed lines) that are coolant fluid-cooled with a cold plate 78. Cool coolant is circulated from the coolant supply conduit 60 to each cold plate 76, 78 in each node 30 before returned warmed coolant to the coolant return manifold 62. The chassis fans 24 may draw air through the nodes 30 in order to cool other heat-generating components (not shown).

Figure 5:
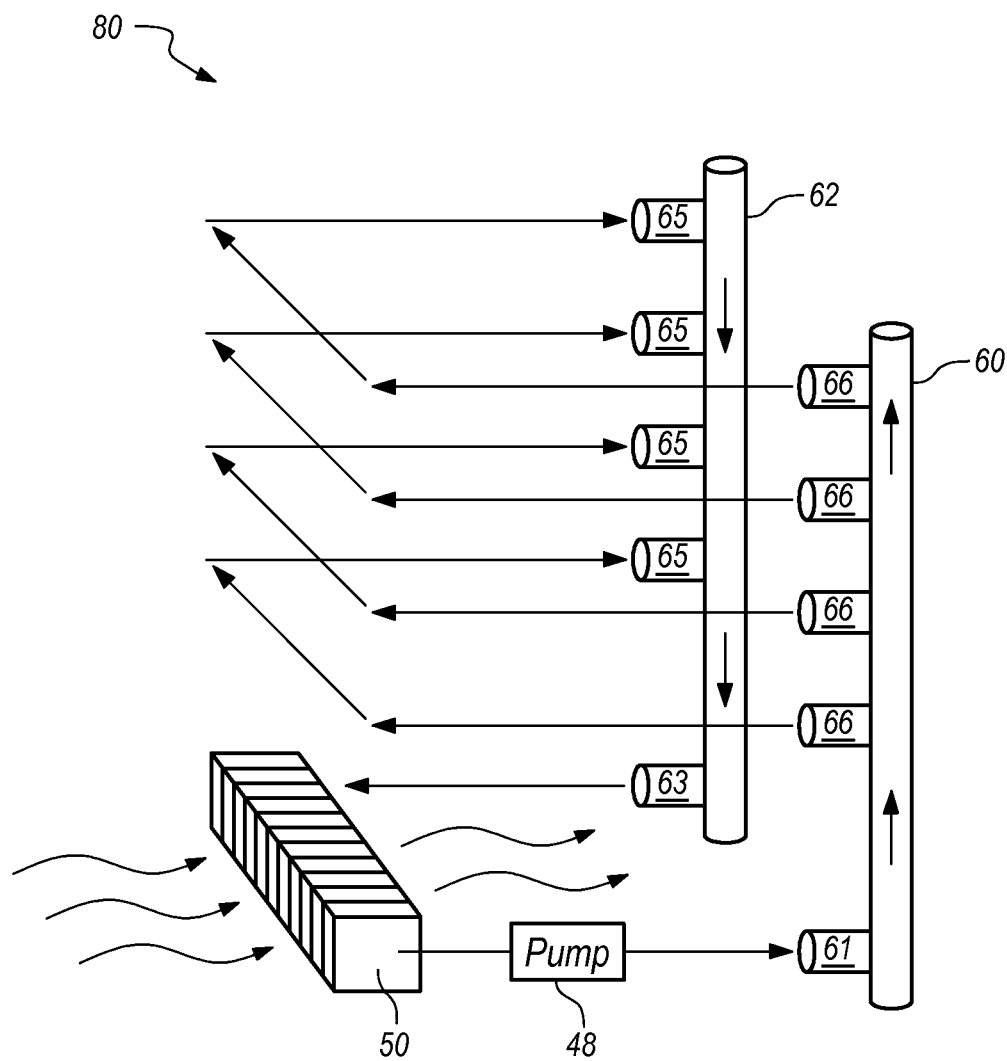
FIG. 5 is a schematic diagram of a coolant circuit for circulating coolant from the coolant unit through the coolant supply manifold to a plurality of nodes and back to the coolant distribution unit through the coolant return manifold.

FIG. 5 is a schematic diagram of a coolant circuit 80 for circulating coolant from the coolant distribution unit through the coolant supply manifold 60 to a plurality of nodes and back to the coolant distribution unit through the coolant return manifold 62. The coolant distribution unit includes the air-to-coolant heat exchanger 50 which cools the coolant and the pump 48 that circulates the coolant through the coolant circuit 80.

In the embodiment shown, coolant flow through the inlet 61 to the coolant supply manifold 60. For any or all of the nodes installed, coolant will flow from an individual outlet 66 of the coolant supply manifold 60, through the cold plates of the nodes, and return as warmed coolant to the inlet 65 of the coolant return manifold 62. The warmed coolant in the coolant return manifold 62 flows through the outlet 63 to the air-to-coolant heat exchanger 50 and the pump 48 before recirculating to the inlet 61 to the coolant supply manifold 60.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system, comprising:
   a chassis including a plurality of node bays, a coolant distribution unit bay, a coolant supply manifold, and a coolant return manifold, wherein the coolant supply manifold includes a coolant supply outlet in each of the node bays and a coolant supply inlet in the coolant distribution unit bay, and wherein the coolant return manifold includes a coolant return inlet in each of the node bays and a coolant return outlet in the coolant distribution unit bay;
   a plurality of nodes, each node having an internal heat exchanger, and each node being operatively received into one of the bays with the internal heat exchanger blind connected in fluid communication with one of the coolant supply outlets and one of the coolant return inlets;

a coolant distribution unit including an inlet conduit, an outlet conduit, an air-to-coolant heat exchanger in fluid communication between the inlet conduit and the outlet conduit, and a pump for circulating a coolant from the inlet conduit through the air-to-coolant heat exchanger to the outlet conduit, wherein the coolant distribution unit is operatively received in the coolant distribution unit bay with the outlet conduit blind connected in fluid communication with the coolant supply inlet of the coolant supply manifold and with the inlet conduit blind connected in fluid communication the coolant return outlet of the coolant return manifold; and one or more air movers for moving air through the air-to-coolant heat exchanger of the coolant distribution unit.

2. The system of claim 1, wherein the one or more air movers are fans installed in the multi-node chassis.

3. The system of claim 1, wherein the one or more air movers are fans installed in the coolant distribution unit.

4. The system of claim 1, wherein the one or more air movers include a first set of fans installed in the multi-node chassis and a second set of fans installed in the coolant distribution unit.

5. The system of claim 1, wherein the coolant distribution unit includes a first pump and a second pump in parallel fluid communication with the first pump, wherein either or both of the first and second pumps can circulate the coolant from the inlet conduit through the air-to-coolant heat exchanger to the outlet conduit.

6. The system of claim 1, wherein the coolant distribution unit bay is positioned below the plurality of nodes.

7. The system of claim 6, wherein the coolant distribution unit is received in a 2 U bay.

8. The system of claim 1, wherein the coolant is water.

9. The system of claim 1, wherein the coolant is a mixture of water and glycol.

10. The system of claim 1, wherein the chassis further includes a power supply unit supplying electrical power to the pump of the coolant distribution unit.

11. The system of claim 1, wherein the internal heat exchanger in each node is a cold plate.

12. The system of claim 1, wherein the air-to-coolant heat exchanger in the coolant distribution unit is a fin stack radiator.

13. The system of claim 1, further comprising:

a rack supporting first and second units of the chassis, wherein the coolant supply manifold and the coolant return manifold of the first unit are independent of the coolant supply manifold and the coolant return manifold of the second unit.

14. The system of claim 1, further comprising:

a tray received in one of the node bays, the tray including two of the nodes, wherein the two nodes are fluidically in parallel and share connections with one of the coolant supply outlets and one of the coolant return inlets.

15. The system of claim 1, wherein the pump is operated to control a processor temperature within each of the nodes, and wherein the one or more air movers are operated to control a coolant temperature at an outlet end of the air-to-coolant heat exchanger.

* * * * *